United States Patent [19]
Lee et al.

[11] Patent Number: 6,121,790
[45] Date of Patent: Sep. 19, 2000

[54] PROGRAMMABLE LOGIC DEVICE WITH ENHANCED MULTIPLEXING CAPABILITIES IN INTERCONNECT RESOURCES

[75] Inventors: Andy L. Lee, San Jose; Richard G. Cliff, Milpitas; David Jefferson, San Jose; Cameron McClintock, Mountain View; Kurosu R. Altaf, Sunnyvale, all of Calif.

[73] Assignee: Altera Corporation, San Jose, Calif.

[21] Appl. No.: 09/087,631

[22] Filed: May 29, 1998

Related U.S. Application Data

[60] Provisional application No. 60/062,475, Oct. 16, 1997.

[51] Int. Cl.$^7$ ........................................... G06F 7/38
[52] U.S. Cl. ................................. 326/39; 39/41; 39/38
[58] Field of Search ............................. 326/37, 38, 39, 326/41, 47

[56] References Cited

U.S. PATENT DOCUMENTS

| Re. 34,363 | 8/1993 | Freeman | 307/465 |
|---|---|---|---|
| 3,473,160 | 10/1969 | Wahlstrom | 340/172.5 |
| 4,609,986 | 9/1986 | Hartmann et al. | 364/200 |

(List continued on next page.)

FOREIGN PATENT DOCUMENTS

| 454352 A1 | 10/1991 | European Pat. Off. | H03K 19/177 |
|---|---|---|---|
| 463746 A2 | 1/1992 | European Pat. Off. | G06F 15/60 |
| 630115 A2 | 12/1994 | European Pat. Off. | H03K 19/177 |
| 746105 A2 | 12/1996 | European Pat. Off. | H03K 19/177 |
| 2300950 | 11/1996 | United Kingdom | H03K 19/177 |
| 2311885 | 10/1997 | United Kingdom | H03K 19/177 |
| WO 95/04404 | 2/1995 | WIPO | H03K 19/177 |
| WO 95/22205 | 8/1995 | WIPO | H03K 19/177 |
| WO 95/30952 | 11/1995 | WIPO | G06F 7/38 |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

*Recent Developments in Switching Theory*, A. Mukhopadhyay, ed., Academic Press, New York, 1971, chapters VI and IX, pp. 229–254 and 369–422.

*The Programmable Gate Array Data Book*, 1988, Xilinx, Inc., San Jose, CA.

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," Journal of Solid–State Circuits, vol. 24, No. 3, Jun. 1989, pp. 754–762.

*ACT Family Field Programmable Gate Array Databook*, Apr. 1992, Actel Corporation, Sunnyvale, CA, pp. 1–35 through 1–44.

*Programmable Logic Data Book*, 1994, Xilinx, Inc., San Jose, CA, pp. 2–7, 2–12, and 2–13.

"XC5000 Logic Cell Array Family, Technical Data, Advance Information," Xilinx, Inc., Feb. 1995.

*Primary Examiner*—Michael Tokar
*Assistant Examiner*—Anh Tran
*Attorney, Agent, or Firm*—Fish & Neave; Robert R. Jackson; Pejman Sharifi

[57] ABSTRACT

A programmable logic integrated circuit device is provided with enhanced capability for dynamically multiplexing signals on the device. Controllable connectors that are provided on the device for connecting any of several connector input signals to a connector output are controlled by control signals that can be programmably selected to be either constant or variable signals. If a control signal is selected to be a variable signal, then the connector controlled by that control signal can be operated as a dynamic multiplexer of the input signals to that connector. The controllable connectors may advantageously be used as the connectors that are employed for allowing several possible signal sources to effectively share a smaller of number of signal drivers.

25 Claims, 5 Drawing Sheets

U.S. PATENT DOCUMENTS

| | | | |
|---|---|---|---|
| 4,617,479 | 10/1986 | Hartmann et al. | 307/465 |
| 4,642,487 | 2/1987 | Carter | 307/465 |
| 4,677,318 | 6/1987 | Veenstra | 307/465 |
| 4,713,792 | 12/1987 | Hartmann et al. | 364/900 |
| 4,758,745 | 7/1988 | Elgamal et al. | 307/465 |
| 4,774,421 | 9/1988 | Hartmann et al. | 307/465 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 5,023,606 | 6/1991 | Kaplinsky | 340/825.8 |
| 5,073,729 | 12/1991 | Greene et al. | 307/465.1 |
| 5,121,006 | 6/1992 | Pedersen | 307/465 |
| 5,122,685 | 6/1992 | Chan et al. | 307/465.1 |
| 5,132,571 | 7/1992 | McCollum et al. | 307/465.1 |
| 5,144,166 | 9/1992 | Camarota et al. | 307/465.1 |
| 5,208,491 | 5/1993 | Ebeling et al. | 307/465 |
| 5,218,240 | 6/1993 | Camarota et al. | 307/443 |
| 5,220,214 | 6/1993 | Pedersen | 307/465 |
| 5,225,719 | 7/1993 | Agrawal et al. | 307/465 |
| 5,255,203 | 10/1993 | Agrawal et al. | 364/489 |
| 5,258,668 | 11/1993 | Cliff et al. | 307/465 |
| 5,260,610 | 11/1993 | Pedersen et al. | 307/465 |
| 5,260,611 | 11/1993 | Cliff et al. | 307/465 |
| 5,274,581 | 12/1993 | Cliff et al. | 364/784 |
| 5,338,984 | 8/1994 | Sutherland | 307/465.1 |
| 5,350,954 | 9/1994 | Patel | 307/465 |
| 5,371,422 | 12/1994 | Patel et al. | 326/41 |
| 5,448,186 | 9/1995 | Kawata | 326/41 |
| 5,455,525 | 10/1995 | Ho et al. | 326/41 |
| 5,467,029 | 11/1995 | Taffe et al. | 326/41 |
| 5,469,003 | 11/1995 | Kean | 326/39 |
| 5,483,178 | 1/1996 | Costello et al. | 326/41 |
| 5,509,128 | 4/1996 | Chan | 395/311 |
| 5,594,364 | 1/1997 | Chan et al. | 326/39 |
| 5,677,638 | 10/1997 | Young et al. | 326/39 |
| 5,689,195 | 11/1997 | Cliff et al. | 326/41 |

PROGRAMMABLE LOGIC DEVICE WITH ENHANCED MULTIPLEXING CAPABILITIES IN INTERCONNECT RESOURCES

This application claims the benefit of United States provisional patent application Ser. No. 60/062,475, filed Oct. 16, 1997.

BACKGROUND OF THE INVENTION

This invention relates to programmable logic devices, and more particularly to circuitry for improving the multiplexing capabilities of programmable logic devices.

Programmable logic devices are well known as shown, for example, by Cliff et al. U.S. Pat. No. 5,689,195, Cliff et al. U.S. patent application Ser. No. 08/909,126, Cliff et al. U.S. patent application Ser. No. 08/963,049, Reddy et al. U.S. patent application Ser. No. 08/977,793, and McClintock et al. U.S. patent application Ser. No. 08/999,016, all of which are hereby incorporated by reference herein. Such devices typically include large numbers of relatively small logic modules, each of which is programmable to perform any of several relatively elementary logic functions on input signals applied to the logic module in order to produce one or more logic module output signals. A network of programmable interconnection conductors and other interconnection resources is provided on the device for conveying signals to, from, and/or between the logic modules so that very complex logic functions can be performed by concatenating multiple logic modules in various ways.

Logic modules (also sometimes called subregions) may be grouped together on a programmable logic device in a plurality of so-called regions of programmable logic. Regions may in turn be similarly grouped together on a programmable logic device in a plurality of so-called super-regions of programmable logic. Interconnection resources may be associated with each level in this hierarchy of subregions, regions, and super-regions, and additional interconnection resources may be provided for communicating between the hierarchical levels. For example, inter-subregion interconnection conductors may be provided for conveying signals between the subregions in each region. In addition, inter-region interconnection conductors may be provided for conveying signals between the regions in each super-region. And inter-super-region interconnection conductors may be provided for conveying signals between the super-regions.

The circuitry of known programmable logic devices performs logic very well, and it can also perform some multiplexing operations. (By "multiplexing" is meant the dynamic selection of any one of two or more multiplexer input signals to be the multiplexer output signal. In other words, at different times during operation of the device, different ones of the multiplexer input signals can be selected as the multiplexer output signal.) However, known programmable logic devices tend not to perform multiplexing especially efficiently. For example, known logic modules which include a four-input look-up table may only be able to perform a single two-to-one multiplexing operation. Two of the inputs to the look-up table are used as the multiplexer input signals, a third input to the look-up table is used as a multiplexer selection control signal, and the fourth input to the look-up table may be wasted. Not only is this relatively inefficient use of a logic module, but in addition large numbers of logic modules must be used to perform wide fan-in multiplexing, and these modules must be connected in series (at least to some extent), which inevitably slows down multiplexing operations. Also, the typical absence of dynamic multiplexing capability in the interconnection resources of programmable logic devices means that if multiplexing is desired at any level in a hierarchical structure, the signals to be multiplexed must first be applied to the logic module level where multiplexing can be done and then returned to the hierarchical level requiring the multiplexing (assuming that this hierarchical level is not the logic module level). This can necessitate substantial amounts of inter-level communication, which can be wasteful of resources on the device and which may again slow down multiplexing operations.

In view of the foregoing, it is an object of this invention to provide programmable logic devices with improved multiplexing capabilities.

It is a more particular object of this invention to provide programmable logic devices with multiplexing capabilities in the interconnection resources of those devices.

SUMMARY OF THE INVENTION

These and other objects of the invention are accomplished in accordance with the principles of the invention by providing circuitry for making connections between interconnection conductors on a programmable logic device, which connector circuitry can be dynamically controlled by time-varying data or control signals on the device to connect any of a plurality of signal sources to an output interconnection conductor. Typically, the above-mentioned signal sources include at least one interconnection conductor, and more than one interconnection conductor may be included among those sources. The signal sources may additionally include a logic module output signal. The signals for controlling the multiplexer or connector circuitry of the invention can come from other interconnection conductors on the device, from logic modules on the device, or from any other suitable sources on the device. Programmable logic connectors ("PLCs") may be provided on the device for allowing programmable selection of the control signal from any of several sources. These sources may also include sources of fixed logic 1 or fixed logic 0 signals so that the connector circuitry may be alternatively controlled in a fixed rather than dynamic manner. The output signal of the connector circuitry of this invention may first pass through a driver before being applied to the destination interconnection conductor. In this way the connector circuitry additionally facilitates effective sharing of drivers by several possible signal sources. The connector circuitry of this invention may be included at any level or levels, or between any levels, in a hierarchical interconnection structure. Within any level of interconnection circuity it may be particularly advantageous to include the connector circuitry of this invention where signals may transition from one type of interconnection conductor to another (e.g., from so-called horizontal interconnection conductors (associated with rows of logic regions) to so-called vertical interconnection conductors (associated with columns of logic regions)).

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
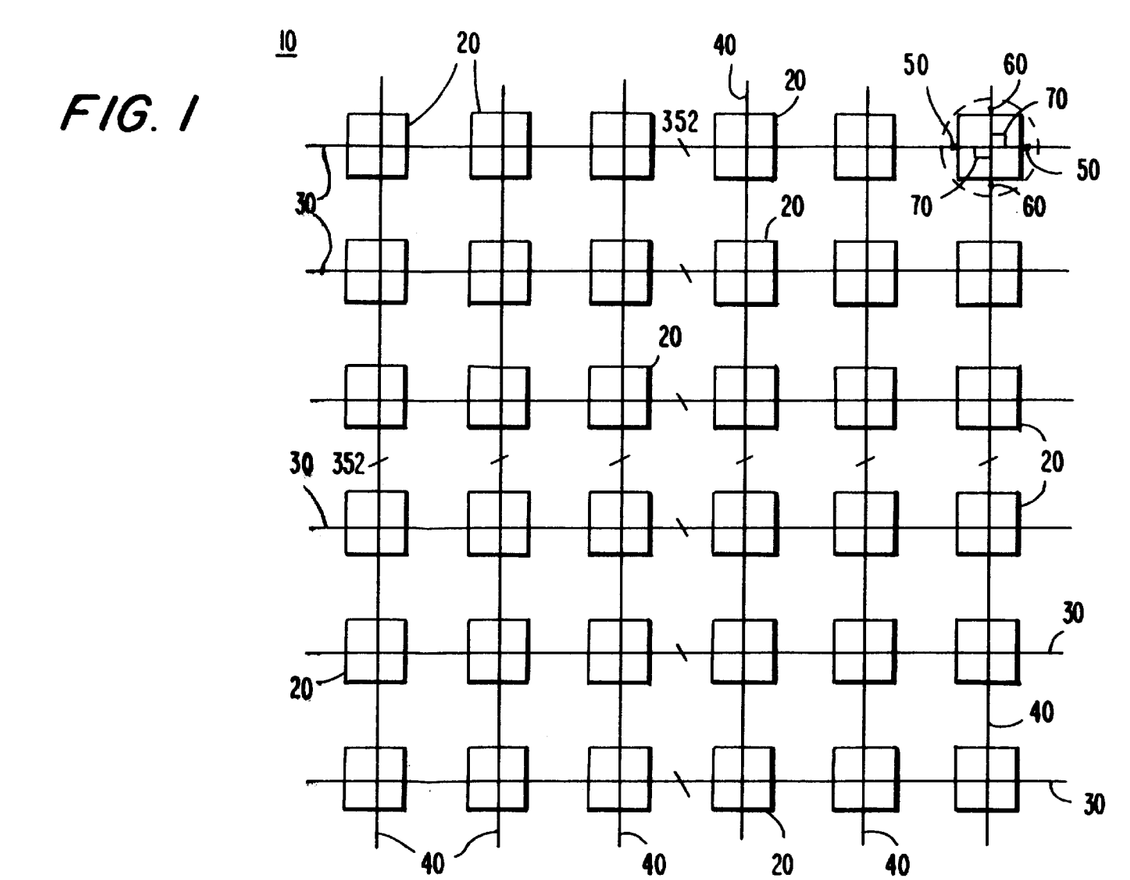
FIG. 1 is a simplified schematic block diagram of an illustrative programmable logic device which can be constructed to include multiplexer circuitry in accordance with this invention.

An illustrative example of a programmable logic device 10 in which certain embodiments of this invention can be included is shown in FIG. 1. This FIG. is the same as FIG. 1 in above-mentioned McClintock et al. U.S. patent application Ser. No. 08/999,016, and so the following description of FIG. 1 can be somewhat abbreviated. A plurality of super-regions 20 of programmable logic are disposed on device 10 in a plurality of intersecting rows and columns of such super-regions. A plurality of horizontal inter-super-region interconnection conductors 30 are associated with each row of super-regions 20 for conveying signals to, from, and/or between the super-regions in the associated row. Similarly, a plurality of vertical inter-super-region interconnection conductors 40 are associated with each column of super-regions 20 for conveying signals to, from, and/or between the super-regions in the associated column. Programmable segmentation buffer circuitry 352 may be provided midway along the length of each conductor 30 and 40 for allowing axially aligned halves of each such conductor to be used either independently or together, depending on whether the circuitry 352 is programmed to electrically isolate the axially aligned halves or to electrically connect those halves.

Programmable logic connectors ("PLCs") 50 are associated with each super-region 20 for selectively making connections between additional interconnection conductors within the super-region and the horizontal conductors 30 that serve that super-region. Similarly, PLCs 60 are associated with each super-region 20 for selectively making connections between additional interconnection conductors within the super-region and the vertical conductors 40 that serve that super-region. PLCs 70 are associated with each super-region 20 for selectively interconnecting horizontal and vertical conductors 30 and 40 that intersect in the vicinity of that super-region.

The above-mentioned McClintock et al. reference provides additional information regarding how the various elements shown in FIG. 1 may be constructed. In general, that material is not needed for an understanding of the present invention, and so it is not repeated herein. However, to the greatest extent possible the same reference numbers are used in present FIG. 2 for elements that are the same as or similar to similarly numbered elements in the McClintock et al. reference to facilitate correlation of circuitry shown in present FIG. 2 with circuitry shown in the McClintock et al. reference.

Figure 2:
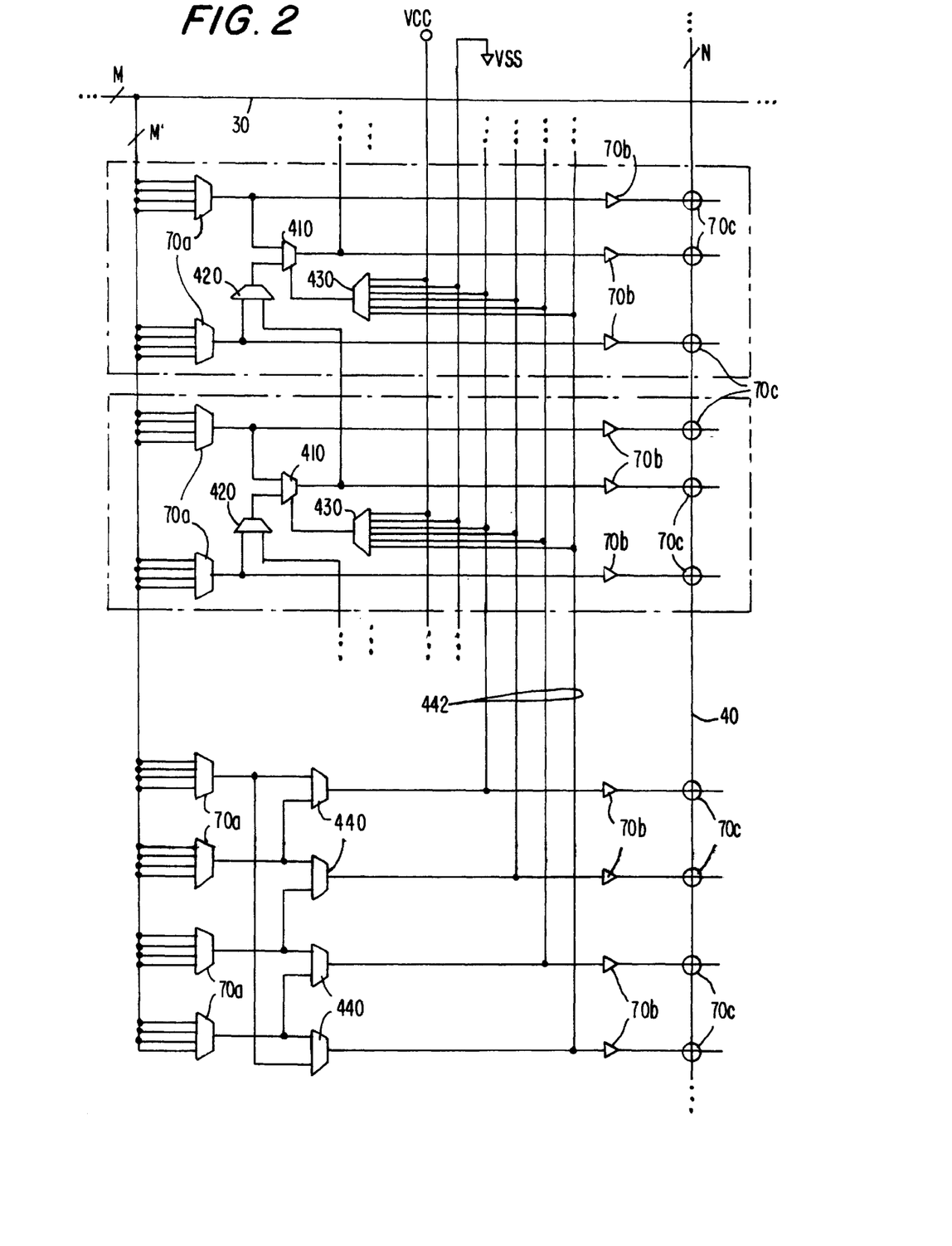
FIG. 2 is a simplified schematic block diagram showing an illustrative embodiment of multiplexer circuitry in accordance with the invention.

FIG. 2 shows how a portion of representative PLC circuitry 70 in FIG. 1 can be modified in accordance with an illustrative embodiment of this invention to provide enhanced multiplexer capability in the interconnect circuitry of the programmable logic device. In the particular example shown in FIG. 2 the portion of representative PLC circuitry 70 that is provided for selectively applying signals from M horizontal conductors 30 to N vertical conductors 40 is shown. (M and N may have the same or different values.) PLCs 70a, drivers 70b, and PLCs 70c are respectively similar to the correspondingly identified elements in FIG. 4 of the above-mentioned McClintock et al. reference. Thus a typical PLC 70a can select the signal on any one of four conductors 30 (via the branches labeled M'). (M' can be the same as M or a subset of M.) The signal selected by each PLC 70a is amplified by an associated driver 70b, and the amplified signal can be applied to any one (or more) of four conductors 40 by the PLC 70c associated with that driver. (Drivers 70b are optional and may not be needed in all embodiments. If drivers 70b are provided, they can be either simple or tri-state devices. The options described in the two immediately preceding sentences apply equally to analogous drivers 570b and 646 shown in other FIGS.)

To provide enhanced multiplexer capability in accordance with this invention, a PLC 410 is added between some pairs of PLC 70a outputs. For example, a PLC 410 is added between the top two PLC 70a outputs shown in FIG. 2, and another PLC 410 is added between the next lower two PLC 70a outputs shown in FIG. 2. Assuming that the PLC 420 associated with each PLC 410 (and described in more detail later) is programmed to connect its left-hand input to its output, each PLC 410 can select either one of the PLC 70a outputs above or below it for application to its associated driver 70b and thence to any one of four (or more) conductors 40 selected by its associated PLC 70c.

Unlike most PLCs shown in FIG. 2, each of PLCs 410 can be dynamically controlled by the output signal of an associated PLC 430. (Most of the PLCs shown in FIG. 2 (e.g., PLCs 70a, 70c, 420, 430, and 440) are programmably controlled (e.g., by programmable function control elements ("FCEs") on the programmable logic device). PLCs 410 are different in the sense that they can be controlled dynamically by data or control signals on the device, which data or control signals can change from time to time. In other respects PLCs 410 can be similar to other PLCs on the device, and so the term "PLC" will sometimes continue to be used for components 410, even though it will be understood that components 410 may be controlled dynamically rather than programmably.)

Each PLC 430 is programmable to select its output signal from one of six inputs to that PLC. The six inputs to each PLC 430 include VCC (logic 1), VSS (logic 0), and four multiplexer selection control signals 442. PLCs 440 are the sources of signals 442. Each of PLCs 440 receives the output signals of two of the four bottom-most PLCs 70a in FIG. 2. Each PLC 440 is programmable to select one of its two input signals to be the associated signal 442 (as well as the signal applied to an associated driver 70b). (PLCs 440 are optional and could be eliminated if it were desired to derive each of signals 442 from a respective fixed one of the four bottom-most PLCs 70a. PLCs 440 are just provided to give some additional flexibility to the choice of the source (among conductors 30) for each of signals 442. If PLCs like 440 are provided, they can be connected to PLC 70a outputs differently than in the particular example shown in FIG. 2.)

From the foregoing it will be seen that each PLC 430 allows the associated PLC 410 to be controlled by a fixed logic 1 signal (from VCC), a fixed logic 0 signal (from VSS), or any one of signals 442. A PLC 410 that thus receives either a fixed logic 0 signal or a fixed logic 1 signal will always output either its upper or lower input signal (depending on which input signal is selected by which control signal input value). A PLC 410 that instead receives as a control signal one of signals 442 (which can be a time-varying or dynamic signal) can output either its upper or lower input signal at different times, depending on the current state of the signal 442 that it receives. Each of PLCs 410 can therefore be operated as a dynamically controlled two-to-one multiplexer for connecting either of two PLC 70*a* output signals (derived from two different ones of conductors 30) to one (or more) of conductors 40. The signal 442 for thus dynamically controlling a PLC 410 comes from another of conductors 30 (via another PLC 70*a* and a PLC 440).

PLCs 420 and associated connections are optionally provided to allow multiplexing of more than two PLC 70*a* outputs. Each PLC 420 is associated with a respective one of PLCs 410 (to which that PLC 420 supplies its output as an input). One of the inputs to each of PLCs 420 (i.e., the left-hand input) is one of the PLC 70*a* outputs associated with the PLC 410 that is associated with that PLC 420. The other input to each of PLCs 420 (i.e., the input on the right) is the output of another adjacent PLC 410. If a PLC 420 between two adjacent PLCs 410 is programmed to pass its right-hand input, then those two adjacent PLCs 410 can be operated in conjunction with one another to provide a dynamically controllable three-to-one multiplexer. For example, if the upper PLC 420 in FIG. 2 is programmed to pass its right-hand input, while the lower PLC 420 in FIG. 2 is programmed to pass its left-hand input, the two PLCs 410 shown in FIG. 2 can provide a three-to-one multiplexer. The three inputs to this multiplexer are the first, third, and fourth (from the top) PLC 70*a* outputs. The lower PLC 410 is controlled by one of signals 442 to select one of the third and fourth PLC 70*a* outputs. The upper PLC 410 is controlled (typically by another of signals 442) to select either the first PLC 70*a* output or the output of lower PLC 410.

FIG. 2 shows that the chain which includes alternating PLCs 410 and 420 can be continued to more 5 circuits similar to those shown in FIG. 2. This allows multiplexing of more than three PLC 70*a* outputs if desired. For example, by using more of such an extended chain, multiplexing of four, five, six, or more PLC 70*a* outputs can be provided.

Although FIG. 2 shows implementing the multiplexing circuitry of this invention in the context of horizontal-to-vertical conductor interconnection circuitry, it will be understood that such multiplexing circuitry can alternatively or additionally be implemented in vertical-to-horizontal conductor interconnection circuitry.

Figure 3:
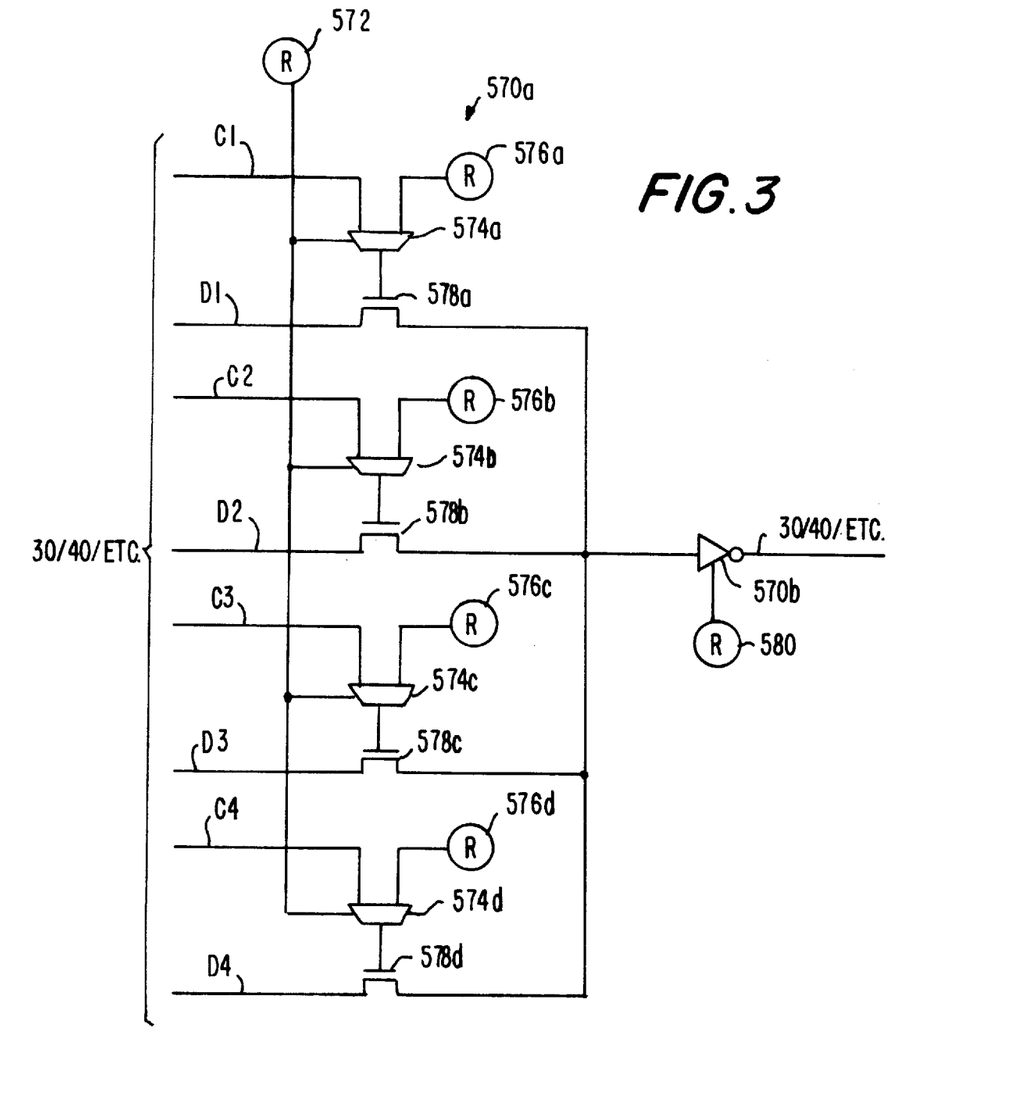
FIG. 3 is a simplified schematic block diagram showing another illustrative embodiment of multiplexer circuitry in accordance with the invention.

FIG. 3 shows another illustrative embodiment of circuitry in accordance with the invention for facilitating the provision of multiplexing in programmable logic devices. As in the embodiment shown in FIG. 2, it is known to provide PLCs (like 70*a*) for allowing a single driver (like 70*b*) to be used for any of several possible routings of signals on the device.

Such sharing of drivers may be desirable, for example, because a driver may need to be fairly large and may therefore take up a relatively large amount of space on the programmable logic device. Embodiments of the type shown in FIG. 3 take advantage of the presence of such PLCs for driver sharing by augmenting such a PLC with additional circuitry for allowing the PLC to alternatively operate as a dynamically controlled multiplexer.

In the illustrative embodiment shown in FIG. 3 PLC 570*a* is provided for applying the signal on any one of leads D1–D4 to tri-state driver 570*b*. (PLC 570*a* can be used for a PLC 70*a* (or a PLC 70*d*) in FIG. 4 of the above-mentioned McClintock et al. reference. Similarly, driver 570*b* can be used for a driver 70*b* (or 70*e*) in FIG. 4 of McClintock et al. Other examples of possible uses of the FIG. 3 circuitry include use of elements 570*a* and 570*b*, respectively, as elements 60*a* and 60*b* in FIG. 5 of McClintock et al., as elements 50*a* and 50*b* in FIG. 6 of McClintock et al., or as elements 50*x*/60*x* and 50*y*/60*y* in FIG. 7 McClintock et al. These latter possibilities (McClintock et al. FIGS. 5–7) are examples of use of the multiplexer connections of this invention between levels in a hierarchical interconnection structure.) If PLC 570*a* is to be operated in programmed (static) mode, FCE 572 is programmed to cause each of PLCs 574*a–d* to pass the output signal of its associated PCE 576*a–d*. FCEs 576 are programmed so that the output signal of a desired one of PLCs 574*a–d* enables its associated PLC 578*a–d*. The enabled PLC 578 passes its associated signal D1–D4 to the input terminal of tri-state driver 570*b*, which can be enabled by appropriately programming FCE 580.

Alternatively, if it is desired to operate PLC 570*a* as a dynamically controlled multiplexer, FCE 572 is programmed so that each of PLCs 574*a–d* passes its left-hand input signal (i.e., the respective one of signals C1–C4). Like signals D1–D4, signals C1–C4 can be time-varying signals in the programmable logic device. Therefore, the choice of which of PLCs 578*a–d* is enabled at any given time can be changed from time to time by changing which of signals C1–C4 has the logical level appropriate for enabling the associated LC 578*a–d*. Thus, in this state of FCE 572, PLC 570*a* is operable as a dynamically controlled multiplexer for applying any one of signals D1–D4 to driver 570*d* at any given time, depending on the states of signals C1–C4 at that time.

FIG. 3 shows that signals C1–C4 and D1–D4 can come from any of several sources such as conductors 30 or 40 in FIG. 1. However, signals D1–D4 may alternatively come from any other sources on a programmable logic device for which signal driving (e.g., by a driver like 570*b*) is needed but can be shared among several such signals. For example, signals D1–D4 could come from additional interconnection conductors within a super-region 20, or more directly from programmable logic circuitry within a super-region 20. Similarly, multiplexer selection control signals C1–C4 can alternatively come from other sources on the programmable logic device such as the alternative sources mentioned above for D1–D4.

FIG. 3 shows the output signal of driver 570*b* going to one (or more) conductors 30 or 40 in FIG. 1, but other output signal destinations requiring a driven or buffered signal are equally possible and appropriate. For example, the driver output signal destination can be an input/output ("I/O") pin of the programmable logic device or one (or more) additional interconnection conductors within a super-region 20.

Use of a tri-state driver 570*b* in circuitry of the type shown in FIG. 3 is optional, and a non-tri-state driver (like 70*b* in FIG. 2) can be used instead if desired. Similarly, the size (i.e., the number of selectable inputs) of a multiplexer like 570*a* in FIG. 3 can be different from the exemplary size shown in that FIG. For example, circuitry of the type shown in FIG. 3 can be extended to have any desired number of data (D) and control (C) inputs to provide a multiplexer with any desired fan-in size (e.g., five-to-one, six-to-one, eight-to-one, etc.).

Figure 4:
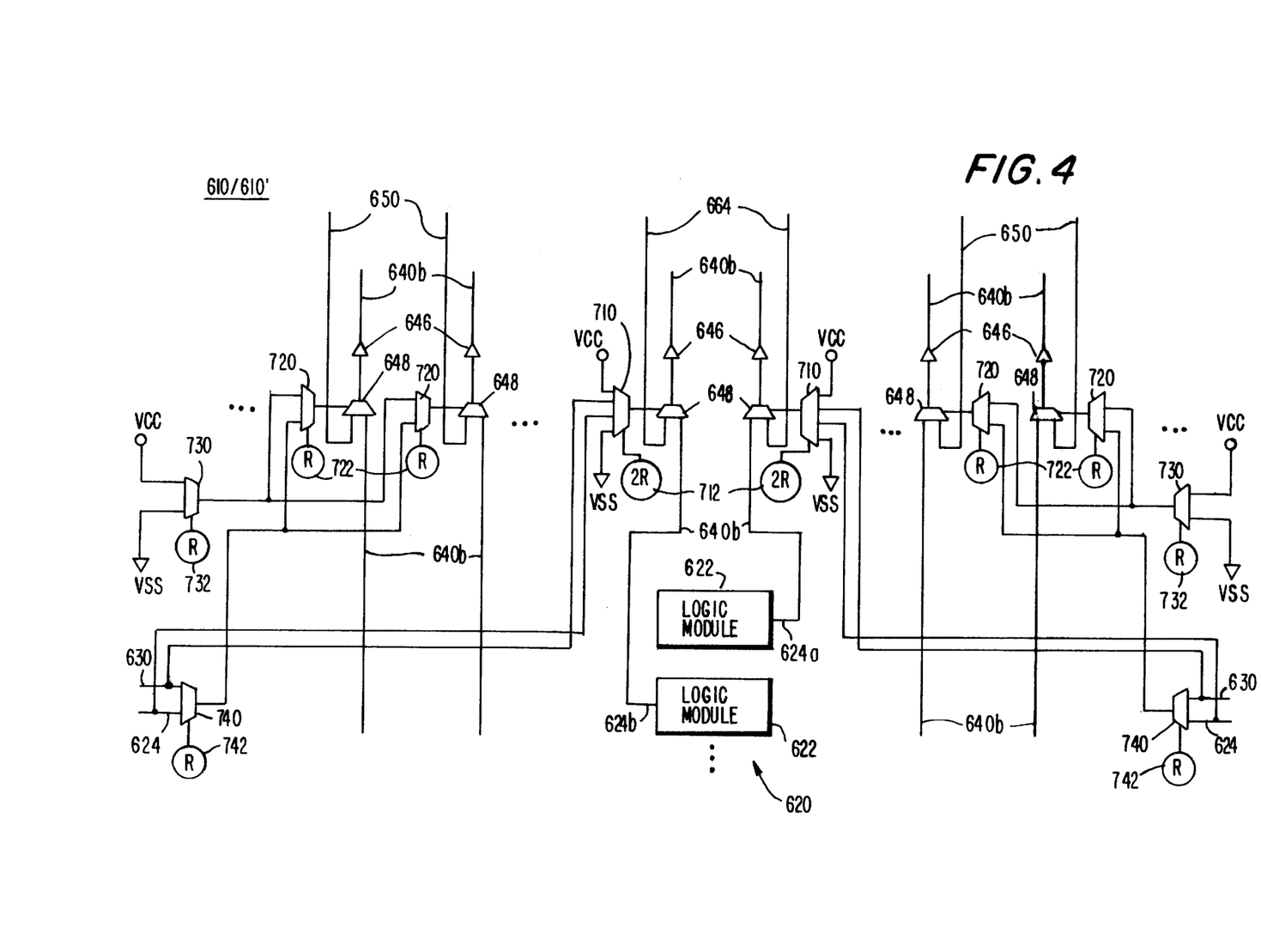
FIG. 4 is a simplified schematic block diagram showing still another illustrative embodiment of multiplexer circuitry in accordance with the invention.

FIG. 4 shows another illustrative embodiment of the invention which may in some respects by regarded as another example of application of principles already discussed in connection with FIG. 3. In FIG. 4 the invention is shown in the context of a programmable logic device architecture of the general kind shown in above-mentioned Cliff et al. U.S. patent application Ser. No. 08/909,126. To facilitate comparison of present FIG. 4 to the immediately above-mentioned Cliff et al. reference, elements in present FIG. 4 with reference numbers in the 600 series have the same last two reference number digits as are used for two-digit reference numbers for the same or similar elements in the Cliff et al. reference. For example, elements 622 in present FIG. 4 can be the same as or similar to elements 22 in the Cliff et al. reference. Elements in present FIG. 4 with reference numbers in the 700 series have no counterparts (or at least no close counterparts) in the Cliff et al. reference. For example, PLCs 710 in present FIG. 4 have no close counterparts in the Cliff et al. reference. Much of the structure shown in the Cliff et al. reference is not repeated in present FIG. 4, but it will be understood that the representative circuitry shown in present FIG. 4 can be used with other structure as shown in the Cliff et al. reference.

In the last-mentioned Cliff et al. reference PLCs 48 are shown as programmably controlled (e.g., by FCEs). In present FIG. 4 at least some of corresponding PLCs 648 can be more dynamically controlled, if desired, by data or control signals on the programmable logic device which can change logic state from time to time. For example, several of PLCs 648 may be controlled by output signals of associated PLCs 710. Each of PLCs 710 is programmably controlled by associated FCEs 712 to output a desired one of its four input signals. These four input signals are VCC (fixed logic 1), VSS (fixed logic 0), an input 630 to one of the logic modules 622 in the group 620 of logic modules that includes the representative depicted logic modules, and an output 624 from one of the logic modules 622 in partly depicted logic module group 620. Because the logical states of these last two signals can change from time to time, either of these last two signals can be used to control a PLC 648 as a dynamically controlled multiplexer. Such a PLC 648 outputs either the applied logic module output signal 624/640 or the applied vertical conductor branch signal 664. (As an alternative to conductor 664 being a vertical conductor branch, conductor 664 could be any other type of interconnection conductor resource on the programmable logic device. For example, conductor 664 could come from a horizontal interconnection conductor 50 rather than a vertical conductor 60 in devices of the type shown in the last-mentioned Cliff et al. reference.) The output signal of each PLC 648 is applied to an associated driver 646 and thence (as shown in the last-mentioned Cliff et al. reference) to a horizontal interconnection conductor 50 and/or to a vertical interconnection conductor 60. If it is not desired to have such dynamic control of a PLC 648 controlled by a PLC 710, the PLC 710 can be programmed to apply either fixed logic 1 or fixed logic 0 to the associated PLC 648. This causes the PLC 648 to programmably (rather than dynamically) select either its input 640*b* or its input 664 as the signal to be applied to the associated driver 646.

FIG. 4 also shows other PLCs 648 that are controlled by the output signals of associated PLCs 720. These PLCs 648 have as their second inputs horizontal interconnection conductor signals 650. Each of PLCs 720 is programmably controlled by an associated FCE 722 to pass either the output signal of an associated PLC 730 or the output signal of an associated PLC 740. Each PLC 730 is programmably controlled by an associated FCE 732 to output either VCC (fixed logic 1) or VSS (fixed logic 0). Each PLC 740 is programmably controlled to output either an associated logic module input signal 630 or an associated logic module output signal 624 (these signals having been described earlier in connection with PLCs 710). Thus again each of the PLCs 648 that are controlled by PLCs 720 can be operated as dynamic multiplexers for applying either a logic module output signal 640*b* or a horizontal interconnection conductor signal 650 to the associated driver 646 and thence to selected horizontal and/or vertical interconnection conductors (50 and/or 60 in the last-mentioned Cliff et al. reference). Alternatively, each PLC 648 that is associated with a PLC 720 can have fixed control.

The PLCs 648 that are controlled by PLCs 710 have somewhat more flexible control in that each of these PLCs 648 can be programmed (via FCEs 712) to have either logic 1, logic 0, input 630, or output 624 as its control signal. The PLCs 648 that are controlled by PLCs 720 have somewhat less flexible control. Each of these PLCs 648 is individually programmable to select either static or dynamic control. But only one selected static control signal and one selected dynamic control signal is available for each left- or right-hand group of these PLCs 648. For example, the left-hand PLC 730 may select either VCC or VSS as the fixed control signal available to the left-hand PLCs 648 that are controlled by PLCs 720. Similarly, the left-hand PLC 740 may select either a logic module input 630 or a logic module output 624 as the dynamic control signal available to the left-hand PLCs 648 that are controlled by PLCs 720.

From the foregoing it will be seen that PLCs 648 can be dynamically controlled (as dynamic two-to-one multiplexers) to apply either logic module output signals 624/640*b* or the signals on adjacent interconnection conductors 650/664 to other ones of the adjacent interconnection conductors. This facilitates the provision of dynamic signal multiplexing in programmable logic devices 610/610' constructed in accordance with this invention.

Figure 5:
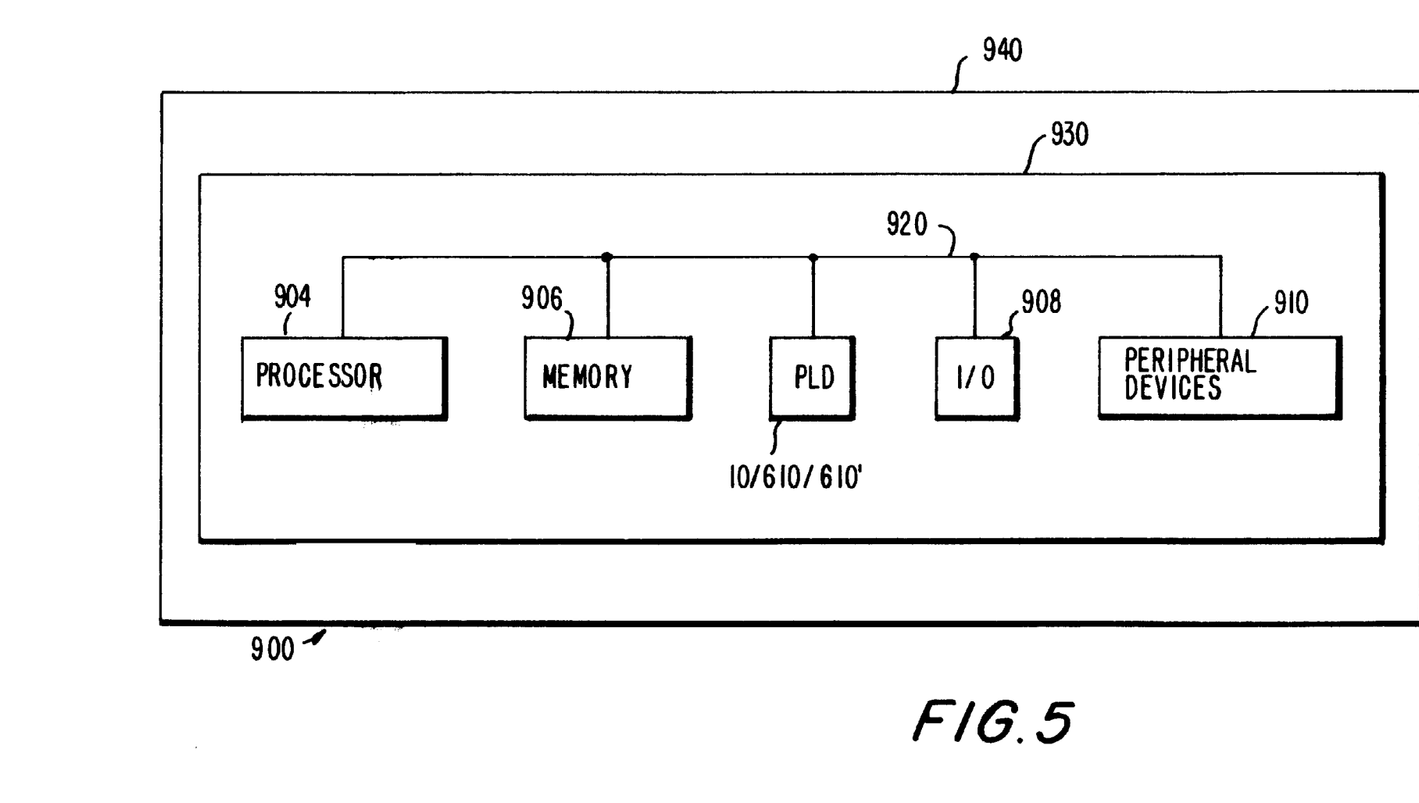
FIG. 5 is a simplified block diagram of an illustrative system employing a programmable logic device incorporating multiplexer circuitry in accordance with the invention.

FIG. 5 illustrates a programmable logic device 10/610/610' (which includes multiplexer circuitry in accordance with this invention) in a data processing system 900. In addition to device 10/610/610', data processing system 900 may include one or more of the following components: a processor 904; memory 906; I/O circuitry 908; and peripheral devices 910. These components are coupled together by a system bus 920 and are populated on a printed circuit board 930 which is contained in an end-user system 940.

System 900 can be used in a wide variety of applications, such as computer networking, data networking, instrumentation, video processing, digital signal processing, or any other application where the advantage of using reprogrammable logic is desirable. programmable logic device 10/610/610' can be used to perform a variety of different logic functions. For example, programmable logic device 10/610/610' can be configured as a processor or controller that works in cooperation with processor 904. Programmable logic device 10/610/610' may also be used as an arbiter for arbitrating access to a shared resource in system 900. In yet another example, programmable logic device 10/610/610' can be configured as an interface between processor 904 and one of the other components in system 900. It should be noted that system 900 is only exemplary, and that the true scope and spirit of the invention should be indicated by the following claims.

The PLCs mentioned throughout this specification (which includes the appended claims) can be implemented in any of a wide variety of ways. For example, each PLC can be a relatively simple programmable connector such as a switch or a plurality of switches for connecting an input or any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. The components of PLCs can be controlled dynamically by data or control signals on the device or more statically by various, programmable, function control elements ("FCEs"), which are not always shown separately in the accompanying drawings. (With certain PLC implementations (e.g., fuses and metal optional links) separate FCE devices are not required, so that in those cases any depiction of FCE devices in the accompanying drawings merely indicates that the PLCs are programmable.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. PLCs that can be controlled dynamically in accordance with this invention are sometimes referred to herein and in the appended claims simply as connectors or the like to ensure that they will not be misunderstood to be only programmably controlled.

From the various examples mentioned above it will be seen that this invention is applicable both to one-time-only programmable devices and to reprogrammable devices.

It will be understood that the foregoing is only illustrative of the principles of the invention, and that various modifications can be made by those skilled in the art without departing from the scope and spirit of the invention. For example, the particular programmable logic device architectures with which the multiplexer circuitry of this invention is shown being used in the accompanying drawings are only illustrative, and it will be readily apparent that the invention can be used in many other programmable logic device architectures. It will also be understood that the invention can be used at any hierarchical level or between any levels in a hierarchical programmable logic device. To make the accompanying claims generic in this regard, the term "region" is used to refer to any size subset of the programmable logic on a programmable logic device. Thus a region in the claims may be, for example, what is referred to above as a logic module or subregion, a region, or a super-region. It will be further understood that terms like "row" and "column", "vertical" and "horizontal", "left" and "right", etc., are used herein solely for convenience and with no intention of limiting the invention to uses having any particular orientational or directional characteristics.

The invention claimed is:

1. A programmable logic device comprising:

a plurality of regions of programmable logic;

a plurality of interconnection conductors configured to convey signals to, from, and/or between the regions; and a connector configured to selectively connect any one of a plurality of connector input signals to one of the interconnection conductors, the connector input signals including at least one signal that is received from another of the interconnection conductors without passing through a combinatorial logic gate, the connector being further configured to respond to a selection control signal on the programmable logic device which can vary in logical state from time to time during operation of the programmable logic device, the connector selecting different ones of the connector input signals at different times depending on the logical state of the selection control signal at each such time.

2. The programmable logic device defined in claim 1 further comprising:

a first source of a first signal having a predetermined fixed logical state;

a second source of a second signal having a logical state which can vary from time to time during operation of the programmable logic device; and a selection control signal circuit configured to produce the selection control signal from either one of the first and second signals.

3. The programmable logic device defined in claim 2 wherein the selection control signal circuit is programmable to select the one of the first and second signals from which the selection control signal is produced by the selection control signal circuit.

4. The programmable logic device defined in claim 1 further comprising:

a first source of a first signal having a fixed logic 1 state;

a second source of a second signal having a fixed logic 0 state;

a third source of a third signal having a logical state which can vary from time to time during operation of the programmable logic device; and a selection control signal circuit configured to produce the selection control signal from any one of the first, second, and third signals.

5. The programmable logic device defined in claim 4 wherein the selection control signal circuit is programmable to select the one of the first, second, and third signals from which the selection control signal is produced by the selection control signal circuit.

6. The programmable logic device defined in claim 1 further comprising:

a first source of a first signal having a predetermined fixed logical state;

plural second sources of plural second signals each having respective logical state which can vary from time to time during operation of the programmable logic device; and a selection control circuit configured to produce the selection control signal from any one of the first and second signals.

7. The programmable logic device defined in claim 6 wherein the selection control signal circuit is programmable to select the one of the first and second signals from which the selection control signal is produced by the selection control signal circuit.

8. The programmable logic device defined in claim 1 wherein each of the interconnection conductors extends between a respective associated subplurality of the regions, whereby that interconnection conductor can be used to convey signals between the regions in the associated subplurality.

9. The programmable logic device defined in claim 8 wherein the regions are disposed on the programmable logic device in a two-dimensional array of intersecting rows and columns of regions, wherein the interconnection conductors include a first subplurality of interconnection conductors which extend along regions in a row and a second subplurality of interconnection conductors which extend along regions in a column, and wherein at least one of the connector input signals is from an interconnection conductor in the first subplurality and the interconnection conductor to which the connector can connect any one of its connector input signals is in the second subplurality.

10. The programmable logic device defined in claim 9 wherein all of the connector input signals are from interconnection conductors in the first subplurality.

11. The programmable logic device defined in claim 1 wherein the selection control signal is derived from the signal on yet another of the interconnection conductors.

12. The programmable logic device defined in claim 11 further comprising:

programmable selection circuitry configured to derive the selection control signal from the signal on any one of a subplurality of the interconnection conductors.

13. The programmable logic device defined in claim 1 further comprising:

programmable selection circuitry configured to derive the selection control signal from any one of a plurality of signal sources on the programmable logic device.

14. The programmable logic device defined in claim 13 wherein the plurality of signal sources includes:

an input signal to one of the regions.

15. The programmable logic device defined in claim 13 wherein the plurality of signal sources includes:

an output signal from one of the regions.

16. The programmable logic device defined in claim 13 wherein the plurality of signal sources includes:

one of the interconnection conductors.

17. The programmable logic device defined in claim 13 wherein the plurality of signal sources includes:

a fixed logic 1 signal.

18. The programmable logic device defined in claim 13 wherein the plurality of signal sources includes:

a fixed logic 0 signal.

19. The programmable logic device defined in claim 1 wherein the connector input signals include an output signal of one of the regions.

20. The programmable logic device defined in claim 1 wherein the connector is programmable with respect to how many connector input signals are included in the plurality of connector input signals.

21. The programmable logic device defined in claim 1 further comprising:

driver circuitry operatively connected in an output signal path of the connector and configured to strengthen the signal selected by the connector for connection to the one of the interconnection conductors.

22. A digital processing system comprising:

processing circuitry;

a memory coupled to said processing circuitry; and a programmable logic device as defined in claim 21 and coupled to the processing circuitry and the memory.

23. A printed circuit board on which is mounted a programmable logic device as defined in claim 21.

24. The printed circuit board defined in claim 23 further comprising:

a memory mounted on the printed circuit board and coupled to the memory circuitry.

25. The printed circuit board defined in claim 23 further comprising:

processing circuitry mounted on the printed circuit board and coupled to the memory circuitry.

* * * * *